United States Patent [19]
Ladany et al.

[11] 4,131,904
[45] Dec. 26, 1978

[54] DEGRADATION RESISTANCE OF SEMICONDUCTOR ELECTROLUMINESCENT DEVICES

[75] Inventors: Ivan Ladany, Stockton; Henry Kressel, Elizabeth, both of N.J.

[73] Assignee: RCA Corporation, New York, N.Y.

[21] Appl. No.: 811,289

[22] Filed: Jun. 29, 1977

[51] Int. Cl.² ............................................. H01L 33/00
[52] U.S. Cl. ...................................... 357/17; 357/16; 357/63; 357/64; 148/171
[58] Field of Search ....................... 357/17, 16, 18, 63, 357/64; 148/171

[56] References Cited
U.S. PATENT DOCUMENTS

| | | | |
|---|---|---|---|
| 3,912,923 | 10/1975 | Kasano | 250/211 J |
| 4,011,113 | 3/1977 | Thomspon | 148/175 |
| 4,023,062 | 5/1977 | Kressel | 313/498 |

*Primary Examiner*—Martin H. Edlow
*Attorney, Agent, or Firm*—H. Christoffersen; B. E. Morris; D. S. Cohen

[57] ABSTRACT

The P type conductivity layer or layers of an electroluminescent device includes zinc as the primary conductivity modifier, and germanium as the secondary conductivity modifier. The combination of zinc and germanium provide an electroluminescent device having improved reliability. In the method of fabricating the P type conductivity layer, the zinc and germanium are simultaneously introduced into the layer during deposition of the layer.

6 Claims, 1 Drawing Figure

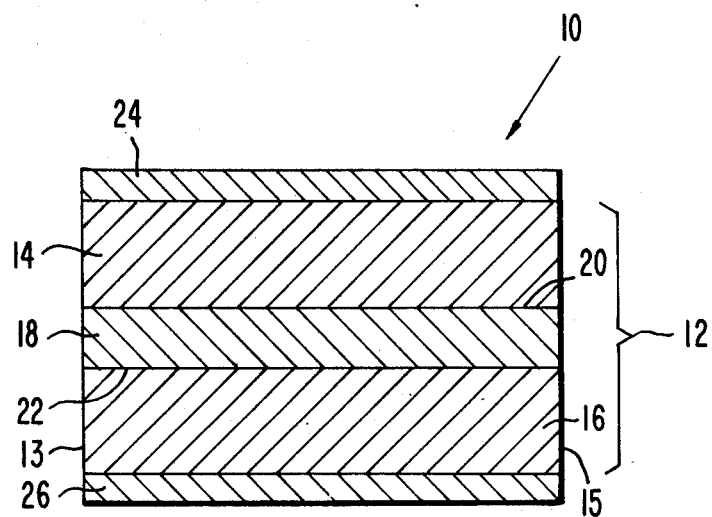

DEGRADATION RESISTANCE OF SEMICONDUCTOR ELECTROLUMINESCENT DEVICES

BACKGROUND OF THE INVENTION

The Government has rights in this invention pursuant to Contract No. NAS1-14349 awarded by NASA, the National Aeronautics and Space Administration.

The present invention relates to an electroluminescent device and a method of fabrication thereof which provides improved reliability.

Electroluminescent devices, in general, are bodies of a single crystalline semiconductor material which, when biased with a current, emit light through the recombination of pairs of oppositely charged carriers. Typically, electroluminescent devices are devices such as light emitting diodes and lasers. Such devices generally include regions of opposite conductivity type forming a PN junction therebetween. When the junction is properly biased, charged carriers of one type are injected from one of the regions into the other where the predominant charge carriers are of the opposite conductivity type.

In the field of electroluminescent devices and in particular with respect to semiconductor lasers of III-V compounds emitting short wavelength radiation, i.e., 7,600 angstroms or less, a problem that has existed is gradual degradation of the device, i.e., the generated optical radiation output is reduced as a function of time at a given current drive. This reduction in light output occurs in the course of the device operation without any evidence of mechanical damage.

The phenomenon of gradual degradation is a function of the current density of operation and results from the formation of non-radiative centers in the recombination region. It is believed that one possibility for the formation of these non-radiative centers is clustering of point defects in the recombination region. For this phenomenon to take place, there must be a substantial number of point defects present in the crystal. Among the most important of these defects are vacancies, for a large number of vacancies can account for movement of dislocation and impurities during operation.

BRIEF DESCRIPTION OF THE DRAWINGS

The FIGURE is a cross-sectional view of an electroluminescent device of the present invention.

SUMMARY OF THE INVENTION

An electroluminescent device includes a body of semiconductor material having at least one P type conductivity layer. The P type conductivity layer has zinc as a primary conductivity modifier and germanium as a secondary conductivity modifier. In the method of fabricating the P type layer, the zinc and germanium are preferably simultaneously introduced into the layer.

DETAILED DESCRIPTION OF THE INVENTION

Although the exact reason for the improved results obtained according to the present invention are unknown, it is believed that among semiconductor light emitting devices utilizing zinc as the P type conductivity modifier especially, vacancies occur in the P type doped layers and diffuse into the recombination region during the operation of the device. It is believed that these vacancies are significantly reduced, or are prevented from diffusing into the recombination region when germanium, as the secondary P type conductivity modifier, is simultaneously introduced into the P type conductivity layer along with the zinc as the primary conductivity modifier. Applicants have found that this method and the resulting structure provide a significant improvement towards the reduction of gradual degradation.

Referring to the FIGURE, the semiconductor electroluminescent device of the present invention is designated as 10. The semiconductor electroluminescent device 10 may be a light emitting diode or a laser. However, for the purpose of describing the present invention, the device 10 is assumed to be a double heterojunction laser. The semiconductor device 10 includes a body 12 of semiconductor material capable of generating optical radiation when properly forward biased. Typically, the body 12 is of semiconductor material such as those found in the Groups III and V of the Periodic Table of Elements. The body 12 is a rectangular parallelipiped having opposed facet surfaces 13 and 15. Usually, at least one of the facet surfaces 13 and 15 are partially reflecting to the generated optical radiation.

Body 12 includes a first layer 14 at one surface of the body and a second layer 16 at the opposite surface of the body 12. A third layer 18 is between and contiguous to both first and second layers 14 and 16 respectively. The third layer 18 is the recombination region of the device 10 when properly forward biased.

For the purpose of describing the present invention the body 12 is assumed to be of aluminum gallium arsenide; however, another suitable material is gallium arsenide. The third layer 18 differs in its aluminum and gallium concentration from that of the first and second layers, thereby forming a first heterojunction 20 with the first layer 14 and a second heterojunction 22 with the second layer 16. By way of example, the first layer 14 has a composition of $Al_{.55}Ga_{.45}As$, the second layer 16 also has a composition of $Al_{.55}Ga_{.45}As$, while the third layer 18 has a composition of $Al_{.2}Ga_{.8}As$.

The first layer 14 is of P type conductivity wherein the primary conductivity modifier is zinc. The zinc typically has a concentration of approximately $1 \times 10^{18}$ acceptor atoms/cm$^3$. The first layer 14 also includes germanium as a secondary conductivity modifier, in a concentration in the range of $5 \times 10^{16}$ to $1 \times 10^{17}$ acceptor atoms/cm$^3$. As is described in more detail below, the zinc and germanium are preferably simultaneously introduced into the first layer 14 during its fabrication.

We have discovered that when the P type layer of the electroluminescent device 10 is doped with zinc and germanium there is an improvement in the device's resistance to degradation. Preferably the zinc and germanium are introduced simultaneously in the device 10. It is well known to those skilled in the semiconductor art that both germanium and zinc are P type conductivity modifiers in aluminum gallium arsenide. The zinc functions as the dominant conductivity modifier in the present invention because large concentrations of germanium are not present.

The second layer 16 is of N type conductivity and doped with conductivity modifiers well known to those skilled in the art such as tellurium at a concentration of about $5 \times 10^{17}$ to $5 \times 10^{18}$ donor atoms/cm$^3$. The third layer 18 may be of either conductivity type, or, as in the present case, it can be undoped.

On a surface of the body 12 and in electrical contact with the first layer 14, and second layer 16 are means for making electrical contact to the body 12. These means may include a first electrode 24 in contact with the first layer 14 and a second electrode 26 in contact with the second layer 16. The first electrode 24 is of a material capable of forming an ohmic contact with the first layer 14, for example, gold and chromium. The second electrode 26 is of a material capable of forming an ohmic contact with the second layer 16, such as tin.

In the operation of the electroluminescent device 10, the device 10 is forward biased by contacting the first electrode 24 to the positive potential terminal of an external energy source (not shown) and contacting the second electrode 26 to the negative potential terminal of the external energy source. As a result of the forward bias voltage, charged carriers are injected into the third layer 18 from the first and second layers 14 and 16. The oppositely charged carriers injected into the third layer 18 recombine in the third layer 18 to generate optical radiation. The first and second heterojunctions 20 and 22 function as waveguides to the optical radiation and typically direct the generated optical radiation towards one of the facet surfaces 13 or 15. While traveling along the third layer 18 towards a facet surface, the optical radiation will grow in intensity as a result of stimulated emission until it reaches a facet surface, either 13 or 15. At the facet surface, the radiation may be reflected back into the third layer 18 so that the amplification of the radiation can continue. The optical radiation amplitude will be built up by its repeated passage through the third layer 18. With at least one of the facet surfaces 13 or 15 being partially transparent to the generated radiation, a portion of the radiation can escape through it, constituting the optical radiation output of the electroluminescent device 10.

Apparatus suitable for fabricating the electroluminescent device 10 having a resistance to degradation is described in U.S. Pat. No. 3,565,702, "Depositing Successive Epitaxial Semiconductor Layers From The Liquid Phase" by H. Nelson, Feb. 23, 1971; U.S. Pat. No. 3,753,801, "Method Of Depositing Epitaxial Semiconductor Layers From The Liquid Phase" by H. F. Lockwood et al., Aug. 21, 1973; and U.S. Pat. No. 3,897,281, "Method For Epitaxially Growing A Semiconductor Material On A Substrate From The Liquid Phase" by S. L. Gilbert et al., July 29, 1975. The basic apparatus taught by these patents is a refractory furnace boat which is typically made of an inert material such as graphite. As is well known to those skilled in the art, these refractory furnace boats are provided with a plurality of wells which are spaced apart, with a passage that extends longitudinally through the boat from one end to the other and extends across the bottom of the wells. A moveable slide of a refractory material, such as graphite, moveably extends through the passage so that the upper surface of the slide forms the bottom surface of the wells. The slide has a recess which is large enough to accomodate a substrate on which the electroluminescent device 10 is grown. In growing the electroluminescent device 10, a first charge will be placed in a first well, and a second charge is placed in a second well and a third charge is placed in a third well. Each charge is a mixture of a semiconductor material of the layer to be deposited, a metal solvent for the semiconductor material and a conductivity modifier if the layer is to be doped. Specifically, the first charge in the first well for the deposition of the second layer 16 includes 50 mg of gallium arsenide, 5 mg of aluminum and 0.4 mg of tellurium as the conductivity modifier. The second charge, from which is deposited the third layer 18, includes 65 mg of gallium arsenide and 1.4 mg of aluminum. The third charge, from which the first layer 14 is deposited, includes 50 mg of gallium arsenide, 5 mg of aluminum, 14 mg of zinc and 20 mg of germanium. The metal solvent for the semiconductor materials of the three charges is gallium, and more gallium arsenide is supplied to the charges of an elevated temperature to ensure saturation. The proportions of the ingredients of gallium and gallium arsenide is preferably such that when the semiconductor material is dissolved into the molten metal solvent, the resulting solution will be saturated with the semiconductor material.

The substrate in this particular example is assumed to be of gallium arsenide, and is placed in the recess of the moveable slide and then the boat is placed in a heated furnace. The furnace is turned on to heat the contents of the furnace boat to a temperature at which the ingredients of the charges are dissolved, for example between 800° C. to 950° C. for gallium arsenide and aluminum. This temperature is maintained long enough to ensure complete melting and homogenization of the ingredients of the charges. Thus, the first, second and third charges become first, second and third solution, respectively. As is obvious from the described method of liquid phase epitaxy, deposition of both the zinc and germanium are simultaneous in the fabrication of the first layer 14. During the heating and deposition process, the tops of the wells in the furnace boat are covered so as to prevent evaporation.

After the furnace boat reaches a temperature at which the ingredients of the charge have been dissolved and homogenized, the slide is moved under each of the wells respectively for the sequential deposition of the three layers 16, 18 and 14. The deposition of the layers is commenced by placing the furnace on a cooling program. The sequential cooling of the melts causes materials in the melts to precipitate out, thereby forming the three layers 16, 18 and 14.

The substrate and body 12 are removed from the recess in the slide, and the substrate removed from body 12 by conventional techniques. The first and second electrodes 24 and 26 are deposited on body 12 by state of the art evaporation techniques. Surfaces of the body 12 are then cleaved so as to form facet surfaces 13 and 15.

While in the example of the device 10 of the present invention there is only one P type conductivity layer described, it is anticipated by the present invention that if more than one P type layer is to be present in an electroluminescent device, such P type layers may include both zinc and germanium as taught in the present invention.

The semiconductor electroluminescent device and method of fabrication of the present invention significantly increases electroluminescent device resistance to degradation.

We claim:

1. An electroluminescent device having a body of semiconductor material of a group III-V compound or mixed group III-V compound comprising:
    a first layer of P type conductivity at one surface of said body, said layer having zinc as a primary conductivity modifier and germanium as a secondary conductivity modifier of a concentration smaller than the concentration of the zinc primary conductivity modifier;
a second layer of N type conductivity at an opposite surface of said body; and
a third layer between and contiguous to said first and second layers being of a material which forms hetero-junctions with said first and second layers, and being the recombination region of the device.

2. An electroluminescent device in accordance with claim 1 wherein said body is of aluminum gallium arsenide.

3. An electroluminescent device in accordance with claim 1 wherein said body is of gallium arsenide.

4. An electroluminescent device in accordance with claim 1 wherein said zinc has a concentration of about $1 \times 10^{18}$ acceptor atoms/cm$^3$ and said germanium has a concentration in the range of about $5 \times 10^{16}$ to $1 \times 10^{17}$ acceptor atoms/cm$^3$.

5. An electroluminescent device in accordance with claim 4 further comprising means for making electrical contact to said body.

6. An electroluminescent device in accordance with claim 5 wherein said electrical contacting means comprises a first electrode in contact with said first layer and a second electrode in contact with said second layer.

* * * * *